United States Patent
Kim

(10) Patent No.: US 10,381,089 B2
(45) Date of Patent: Aug. 13, 2019

(54) SEMICONDUCTOR MEMORY SYSTEM PERFORMING READ OPERATION BASED ON COUNTED MEMORY CELLS AND OPERATING METHOD THEREOF

(71) Applicant: SK hynix Inc., Gyeonggi-do (KR)

(72) Inventor: Woo-Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/873,081

(22) Filed: Jan. 17, 2018

(65) Prior Publication Data

US 2018/0350441 A1 Dec. 6, 2018

(30) Foreign Application Priority Data

May 31, 2017 (KR) .................. 10-2017-0067483

(51) Int. Cl.
| | |
|---|---|
| G06F 11/10 | (2006.01) |
| G11C 16/28 | (2006.01) |
| G11C 11/56 | (2006.01) |
| G11C 16/30 | (2006.01) |
| G11C 29/52 | (2006.01) |
| G11C 16/08 | (2006.01) |
| G11C 29/02 | (2006.01) |
| G11C 29/04 | (2006.01) |

(52) U.S. Cl.
CPC .......... *G11C 16/28* (2013.01); *G06F 11/1012* (2013.01); *G11C 11/5642* (2013.01); *G06F 11/1068* (2013.01); *G11C 16/08* (2013.01); *G11C 16/30* (2013.01); *G11C 29/021* (2013.01); *G11C 29/028* (2013.01); *G11C 29/52* (2013.01); *G11C 2029/0409* (2013.01); *G11C 2029/0411* (2013.01)

(58) Field of Classification Search
CPC .. G06F 3/0656; G06F 3/0604; G06F 11/1068; G11C 16/28; G11C 29/52; G11C 16/30; G11C 16/08; G11C 11/5628; G11C 16/3459
See application file for complete search history.

(56) References Cited

U.S. PATENT DOCUMENTS

| | | | |
|---|---|---|---|
| 9,761,321 B2 * | 9/2017 | Lee | G11C 16/26 |
| 2017/0123724 A1 * | 5/2017 | Park | G06F 3/0604 |

FOREIGN PATENT DOCUMENTS

| | | |
|---|---|---|
| KR | 1020140058738 | 5/2014 |
| KR | 1020150020478 | 2/2015 |
| KR | 1020160108656 | 9/2016 |

\* cited by examiner

*Primary Examiner* — David Lam
(74) *Attorney, Agent, or Firm* — IP & T Group LLP

(57) ABSTRACT

A semiconductor apparatus comprising: a memory device including at least a word line; and a controller suitable for controlling the memory device to perform a write operation and a read operation, wherein the controller includes a counting unit suitable for counting a number of memory cells coupled to the word line for respective threshold voltages, and wherein the controller controls the memory device to perform a read operation based on the counted number of memory cells for the respective threshold voltages.

17 Claims, 15 Drawing Sheets

<IDEAL>

SEMICONDUCTOR MEMORY SYSTEM PERFORMING READ OPERATION BASED ON COUNTED MEMORY CELLS AND OPERATING METHOD THEREOF

CROSS-REFERENCE TO RELATED APPLICATION(S)

The present application claims priority of Korean Patent Application No. 10-2017-0067483, filed on May 31, 2017, which is incorporated herein by reference in its entirety.

BACKGROUND

1. Field

Various exemplary embodiments of the present invention relate to a semiconductor memory system and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory device retain their stored data even when their power supplies are interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing 2-bit data per cell is called a multi-bit cell, a multi-level cell (MLC) or a multi-state cell. And a memory cell storing 3-bit data per cell is called a triple-level cell (TLC). The MLC and TLC are advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distribution. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighbouring threshold voltage distributions overlap. As the neighbouring threshold voltage distributions overlap, read data may include error bits.

FIG. 1 is a threshold voltage distribution schematically illustrating program and erase states of a 3-bit TLC non-volatile memory device.

FIG. 2 is a threshold voltage distribution schematically illustrating program and erase states due to characteristic deterioration of the 3-bit TLC non-volatile memory device.

In a TLC non-volatile memory device, e.g., a TLC flash memory device capable of storing 3-bit data (i.e., k=3) in a single memory cell, the memory cell may have one of $2^3$, i.e., 8 threshold voltage distributions.

Threshold voltages of memory cells programmed for the same data form the threshold voltage distribution due to characteristic differences between memory cells. In the 3-bit TLC non-volatile memory device, as illustrated in FIG. 1, threshold voltage distributions are formed in correspondence with the data states including 7 program states 'P1' to 'P7' and an erase state 'E'. FIG. 1 shows an ideal case in which threshold voltage distributions do not overlap and have sufficient read voltage margins therebetween.

Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is an improved scheme for precisely reading data stored in memory cells of a semiconductor memory device.

SUMMARY

In accordance with an embodiment of the present invention, A semiconductor apparatus comprising: a memory device including at least a word line; and a controller suitable for controlling the memory device to perform a write operation and a read operation, wherein the controller includes a counter unit suitable for counting a number of memory cells coupled to the word line for respective threshold voltages, and wherein the controller controls the memory device to perform a read operation based on the counted number of memory cells for the respective threshold voltages.

Preferably, the controller may further include a mapping unit suitable for converting the counted number of memory cells for the respective threshold voltages into range values of accumulated number of cells and mapping the range value of accumulated number of cells to information bits.

Preferably, the information bits may have a value representing one among the range values of accumulated number of cells.

Preferably, the mapping unit may map the counted number of memory cells for the respective threshold voltages to the information bits in a table having a plurality of range values of accumulated number of cells and the information bits.

Preferably, the mapping unit may generate the table by mapping the counted number of memory cells for the respective threshold voltages to the information bits through a binary search scheme.

Preferably, the controller may count as a first value a number of memory cells coupled to the word line and turned on according to a first read voltage, and wherein the controller further includes a read bias determination unit suitable for determining, when the read operation with the first read voltage fails, a second read voltage based on the first value and a range value of accumulated number of cells, which corresponds to the first read voltage among the plurality of range values of accumulated number of cells included in the table.

Preferably, the read bias determination unit may determine the second read voltage such that difference between the first value and a maximum value of the range value of accumulated number of cells, which corresponds to the first read voltage, or difference between the first value and a minimum value of the range of accumulated number of cells, which corresponds to the first read voltage, is under a predetermined threshold value.

Preferably, the read bias determination unit may decrease the second read voltage when the first value is greater than a maximum value of the range value of accumulated number of cells, which corresponds to the first read voltage, and wherein the read bias determination unit increases the second read voltage when the first value is smaller than a minimum value of the range value of accumulated number of cells, which corresponds to the first read voltage.

Preferably, the first read voltage may be a default read voltage or a predetermined read voltage.

In accordance with an embodiment of the present invention, an operating method of a controller, the method comprising: counting a number of memory cells coupled to a word line for respective threshold voltages; and performing a read operation based on the counted number of memory cells for the respective threshold voltages.

Preferably, further comprising a first step of converting the counted number of memory cells for the respective threshold voltages into range values of accumulated number of cells and mapping the range value of accumulated number of cells to information bits.

Preferably, the information bits may have a value representing one among the range values of accumulated number of cells.

Preferably, the first step may include mapping the counted number of memory cells for the respective threshold voltages to the information bits in a table having a plurality of range values of accumulated number of cells and the information bits.

Preferably, the first step further may include generating the table by mapping the counted number of memory cells for the respective threshold voltages to the information bits through a binary search scheme.

Preferably, the counting may be performed by counting as a first value a number of memory cells coupled to the word line and turned on according to a first read voltage, and further comprising a second step of determining, when the read operation with the first read voltage fails, a second read voltage based on the first value and a range value of accumulated number of cells, which corresponds to the first read voltage among the plurality of range values of accumulated number of cells included in the table.

Preferably, the second read voltage may be determined such that a difference between the first value and a maximum value of the range value of accumulated number of cells, which corresponds to the first read voltage, or difference between the first value and a minimum value of the range of accumulated number of cells, which corresponds to the first read voltage, is under a predetermined threshold value.

Preferably, the second step may include: decreasing the second read voltage when the first value is greater than a maximum value of the range value of accumulated number of cells, which corresponds to the first read voltage; and increasing the second read voltage when the first value is smaller than a minimum value of the range value of accumulated number of cells, which corresponds to the first read voltage.

Preferably, the first read voltage may be a default read voltage or a predetermined read voltage.

These and other features and advantages of the present invention will become apparent to those having ordinary skill in the art to which the present invention belongs or relates to from the following detailed description in conjunction with the following drawings.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The scope of the present invention will be understood through the claims of the present invention.

Figure 1:
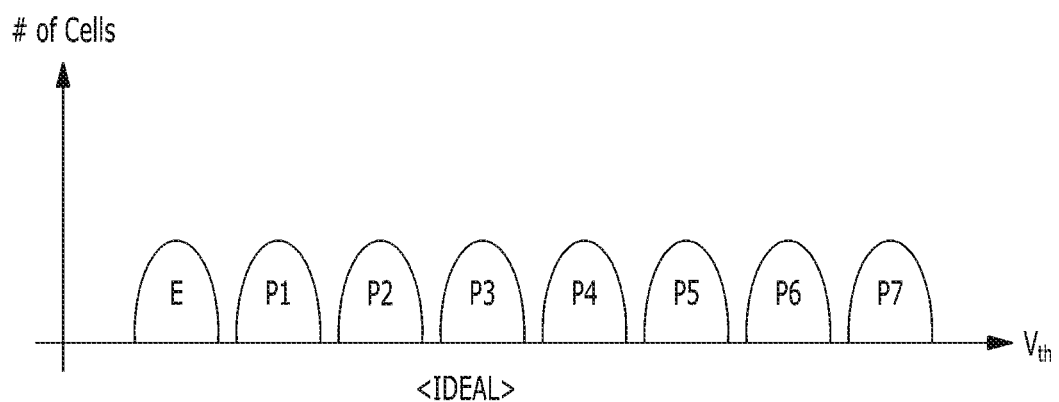
FIG. 1 is a threshold voltage distribution schematically illustrating program and erase states of a 3-bit TLC non-volatile memory device.
Figure 2:
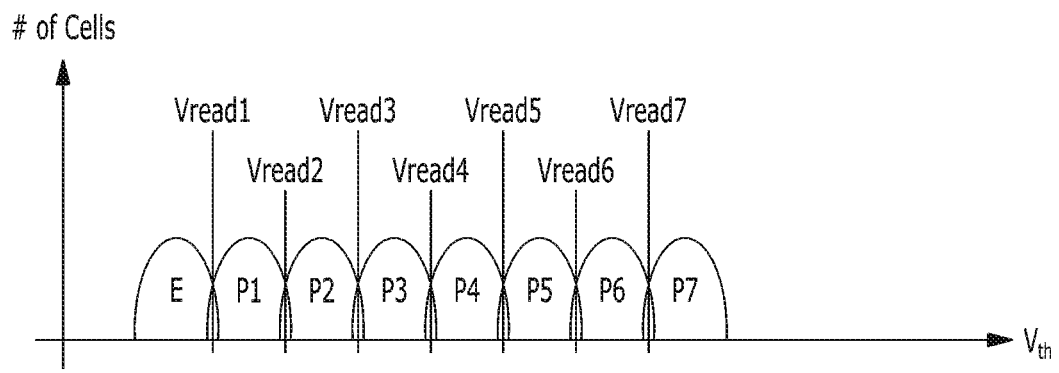
FIG. 2 is a threshold voltage distribution schematically illustrating program and erase states due to characteristic deterioration of a 3-bit MLC non-volatile memory device.
Figure 3:
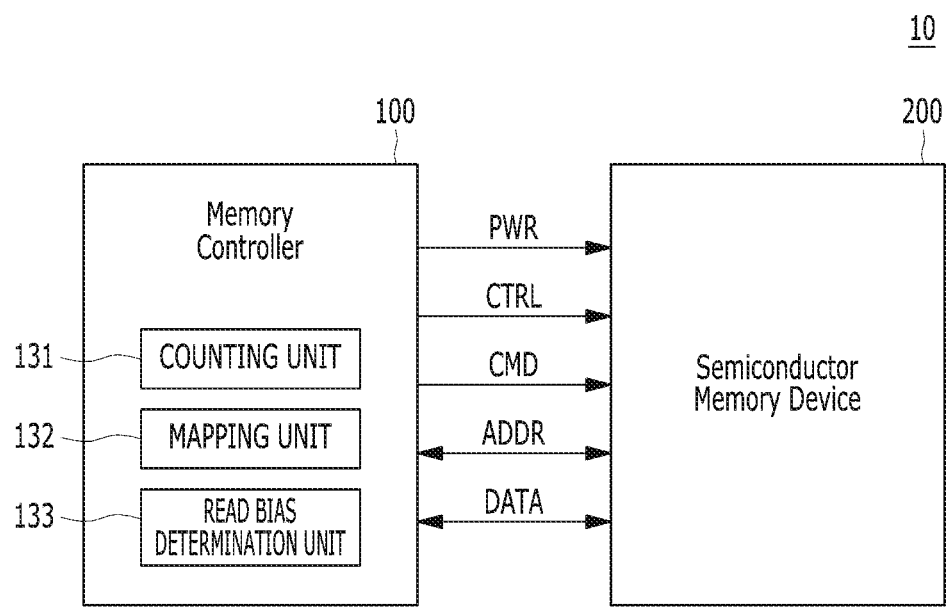
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4A:
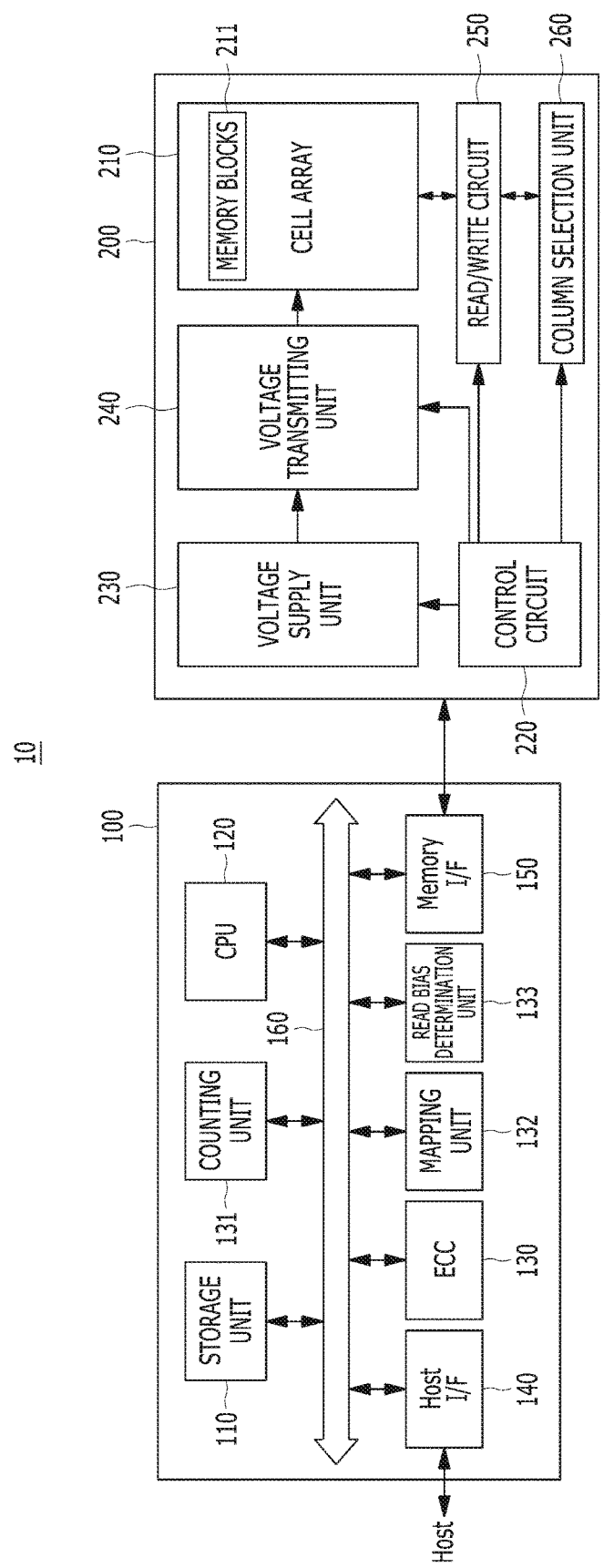
FIG. 4A is a block diagram illustrating a semiconductor memory system shown in FIG. 3.

FIG. 4A is a block diagram illustrating an exemplary configuration of the semiconductor memory system 10 shown in FIG. 3.

Figure 4B:
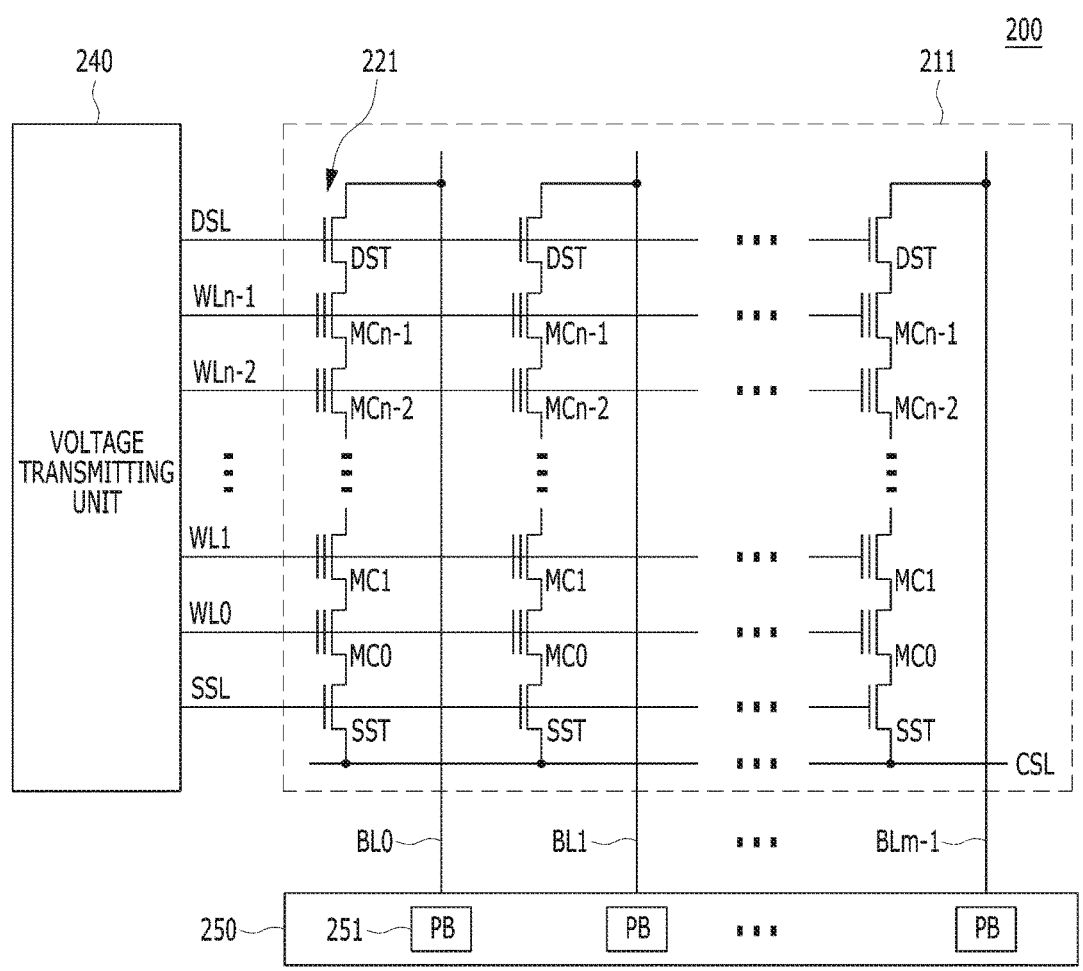
FIG. 4B is a circuit diagram illustrating a memory block shown in FIG. 4A.

FIG. 4B is a circuit diagram illustrating a memory block 211 shown in FIG. 4A.

Figure 5:
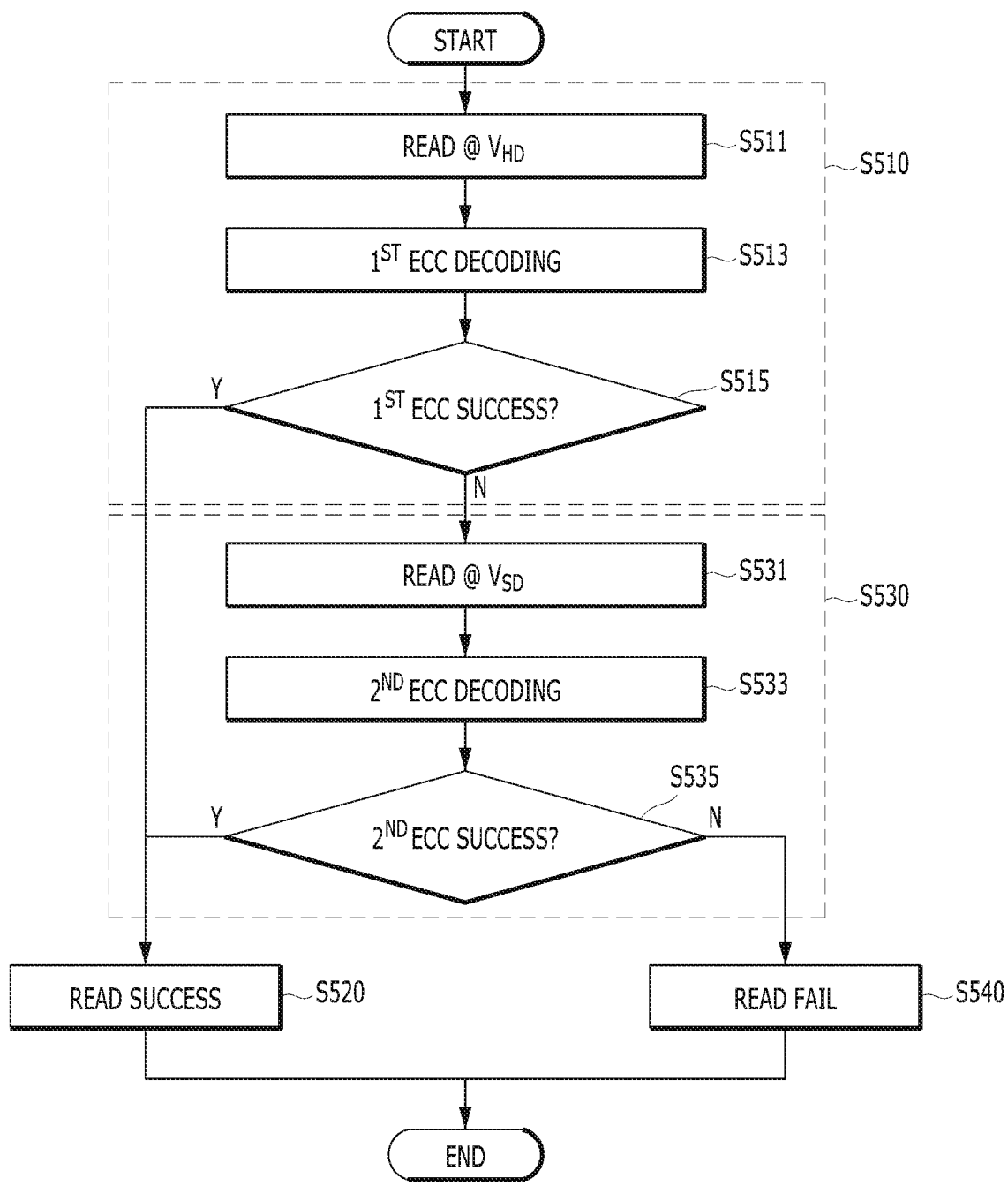
FIG. 5 is a flowchart illustrating an operation of a memory controller shown in FIG. 4A.

FIG. 5 is a flowchart illustrating an operation of a memory controller 100 included in the semiconductor memory system 10.

Referring to FIGS. 3 to 5, the semiconductor memory system 10 may include a semiconductor memory device 200 and the memory controller 100.

The semiconductor memory device 200 may perform one or more of erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include a counting unit 131, a mapping unit 132, and a read bias determination unit 133.

The counting unit 131 may count an accumulated number of cells connected to a target word line of a write operation for each threshold voltage.

Specifically, the memory cells are coupled to the word line. The counting unit 131 may count the number of memory cells coupled to the word line for respective threshold voltages.

The mapping unit 132 may map the accumulated number of cells to information bits for each threshold voltage. In another embodiment, (not shown), the mapping unit 132 may be included in the semiconductor memory device 200.

The read bias determining unit 133 may determine an optimal read bias voltage by referring to the information bits when a read failure occurs.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data centre, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the memory controller 100 may include a storage unit 110, a CPU 120, the ECC unit 130, the counting unit 131, the mapping unit 132, the read bias determining unit 133, a host interface 140, a memory interface 150 and a system bus 160. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE). The counter unit 131, the mapping unit 132 and the read bias determining unit 133 can perform the functions mentioned above with respect to FIG. 3.

The ECC unit 130 may detect and correct errors included in the data read from the semiconductor memory device 200. The memory interface 150 may interface with the semiconductor memory device 200. The CPU 120 may perform various control operations.

In accordance with an exemplary embodiment of the present invention, during the program operation, the ECC unit 130 may perform an ECC encoding to an original data which is to be programmed to the semiconductor memory device 200. In such case, during the read operation, the ECC unit 130 may perform an ECC decoding to the ECC-encoded data or a codeword, which is stored in the semiconductor memory device 200.

The ECC unit 130 may restore the original data, which is data before the ECC encoding operation of the ECC unit 130 during the program operation, by performing the ECC decoding operation to the ECC-encoded data or the codeword stored in the semiconductor memory device 200.

As discussed with reference to FIG. 5, the read operation to the data stored in the semiconductor memory device 200 may include a hard decision read operation of step S511 and a soft hard decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different voltages than the hard decision read voltage $V_{HD}$. For example, an additional read operation according to the soft decision read voltages $V_{SD}$ may be performed to the memory cell, which is read according to the hard decision read voltage $V_{HD}$.

The ECC-encoded data or the codeword, which is stored in the semiconductor memory device 200 and is read through the hard decision read operation, may be decoded back to the original data by the ECC unit 130.

The soft decision read operation is an operation of generating the LLR, which provides the reliability of the hard decision read data read through the hard decision read operation, according to the soft decision read voltages $V_{SD}$ rather than just the read operation to data stored in the semiconductor memory device 200.

The ECC unit 130 may perform the ECC decoding operation to the LLR. The ECC unit 130 may detect and correct the error of the ECC-encoded data or the codeword read from the semiconductor memory device 200 through the LLR.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. Each cell string 221 may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell.

The cell strings 221 may be electrically coupled to the corresponding bit lines BL0 to BLm−1, respectively.

FIG. 4B exemplarily illustrates a memory block 211 comprising a plurality of NAND-type flash memory cells. However, the memory block 211 of the semiconductor memory device 200 is not limited to a NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside, for example, to the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. A target data of the hard and soft decision decoding steps S510 and S530, or the data stored in the semiconductor memory device 200 may be the ECC-encoded data or the cored word, which is ECC encoded by the ECC unit 130.

For example, the hard decision decoding step S510 may be a step of a hard decision ECC decoding for hard decision read data of predetermined length, which is read from a memory cell of the memory block 211 according to the hard decision read voltage $V_{HD}$. The hard decision decoding step S510 may include steps S511 to S515.

For example, the soft decision decoding step S530 may be a step of a soft decision ECC decoding for the hard decision read data by forming soft decision read data according to soft decision read voltages $V_{SD}$ around the hard decision read voltage $V_{HD}$ when the hard decision ECC decoding of the hard decision decoding step S510 finally fails. The soft decision decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The read hard decision read data may be provided to the memory controller 100.

At step S513, the hard decision ECC decoding may be performed. The ECC unit 130 may perform the hard decision ECC decoding to the hard decision read data, which is read from the semiconductor memory device 200 according to the hard decision read voltage $V_{HD}$ by using the error correction code.

At step S515, it may be determined whether the hard decision ECC decoding succeeds or fails. That is, at step S515, it may be determined whether an error of the hard decision read data, to which the hard decision ECC decoding is performed at step S513, is corrected. For example, the memory controller 100 may determine whether an error of the hard decision read data is corrected by using the hard decision read data and a parity check matrix. For example, when a product result of the parity check matrix and the hard decision read data is a zero vector ('0'), it may be determined that the hard decision read data is corrected. On the other hand, when the product result of the parity check matrix and the hard decision read data is not the zero vector ('0'), it may be determined that the hard decision read data is not corrected.

When it is determined that the hard decision read data is corrected as the result of determination of step S515, it may be determined at step S520 that the read operation according to hard decision read voltage $V_{HD}$ at step S511 is successful and the operation of the memory controller 100 may end. The hard decision read data, to which the hard decision ECC decoding is performed at step S513, may be now the error-corrected data and may be provided externally or used in the memory controller 100.

When it is determined that the hard decision read data is not corrected as the result of determination of step S515, the soft decision decoding step S530 may be performed.

As described above, at step S531 of the soft decision read step, the soft decision read data may be read from the semiconductor memory device 200 according to the soft decision read voltages $V_{SD}$. The additional read operation according to the soft decision read voltages $V_{SD}$ may be performed on the memory cell, to which the hard decision decoding step S510 was performed according to the hard decision read voltage $V_{HD}$. The soft decision read voltages $V_{SD}$ may be different than the hard decision read voltage $V_{HD}$.

At step S533, the soft decision ECC decoding may be performed. The soft decision ECC decoding may be performed based on the soft decision read data comprising the hard decision read data, to which the hard decision ECC decoding is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn−1 of the semiconductor memory device 200 may belong to one of the threshold voltage distributions including 7 program states P1 to P7 and 1 erase state E.

The hard decision read voltage $V_{HD}$ may have a voltage between 2 neighbouring states of the plurality of states (E and P1 to P7). Each of the soft decision read voltages $V_{SD}$ may have a voltage between 2 neighbouring states of the plurality of states (E and P1 to P7), which is different from the hard decision read voltage $V_{HD}$.

The hard decision read data read from the memory cells MC0 to MCn−1 according to the hard decision read voltage $V_{HD}$ and the soft decision read data read therefrom according to the soft decision read voltages $V_{SD}$ may have different values. For example, there may be a tailed one of the memory cells MC0 to MCn−1 having the threshold voltage higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn−1 (i.e., additional information on the tailed memory cells) or the log likelihood ratio (LLR) providing reliability of the hard decision read data read by the hard decision read operation may be obtained.

When the additional information is obtained, the probability of the likelihood ratio whether the data of the memory cells MC0 to MCn−1 belong to the first state (i.e., '1'), or the second state (i.e., '0'), may increase. That is, the reliability of the ECC decoding may increase. The memory controller 100 may perform the soft decision ECC decoding based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 6A and 6B.

At step S535, it may be determined whether the soft decision ECC decoding succeeds or fails. That is, at step S535, it may be determined whether an error of the soft decision read data, to which the soft decision ECC decoding is performed at step S533, is corrected. For example, the memory controller 100 may determine whether an error of the soft decision read data is corrected by using the soft decision read data and the parity check matrix. For example, when product result of the parity check matrix and the soft decision read data is the zero vector ('0') it may be determined that the soft decision read data, to which the soft decision ECC decoding is performed, is corrected. On the other hand, when product result of the parity check matrix and the soft decision read data is not the zero vector ('0'), it may be determined that the soft decision read data, to which the soft decision ECC decoding is performed, is not corrected.

The product process of the parity check matrix and the hard decision read data during the hard decision decoding step S510 may be the same as the product process of the parity check matrix and the soft decision read data during the soft decision decoding step S530.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, to which the soft decision ECC decoding is performed at step S533, may be now the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn−1 finally fails and the operation of the memory controller 100 may end.

Figure 6A:
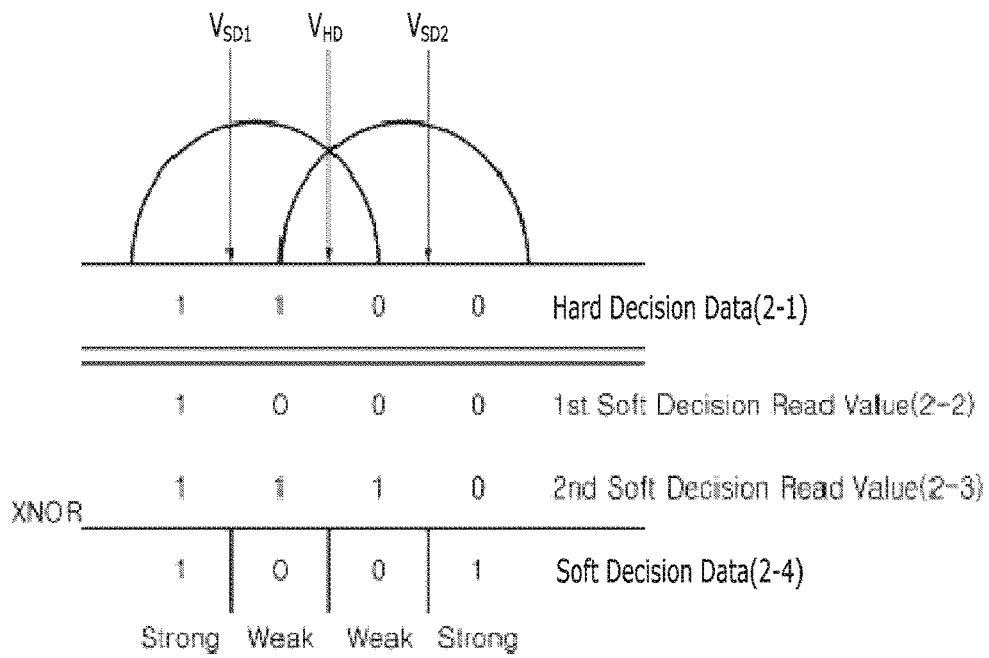
FIG. 6A is a schematic diagram illustrating a 2-bit soft decision read operation as a soft decision read operation shown in FIG. 5.
Figure 6B:
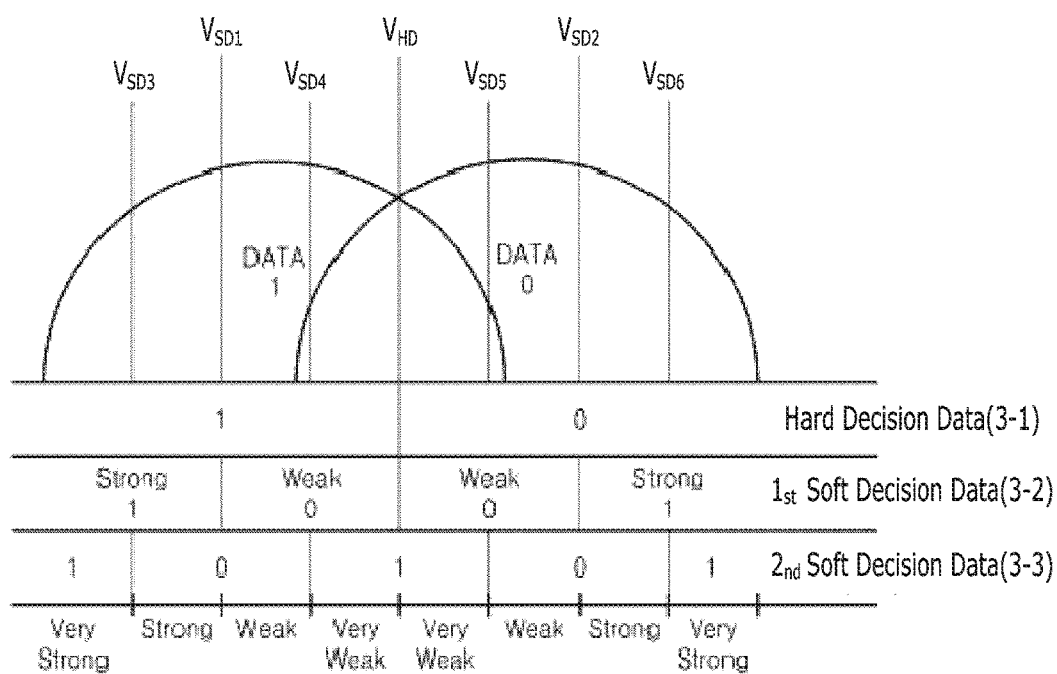
FIG. 6B is a schematic diagram illustrating a 3-bit soft decision read operation as a soft decision read operation shown in FIG. 5.

FIGS. 6A and 6B are schematic diagrams illustrating the soft decision read operation shown in FIG. 5, particularly 2-bit and 3-bit soft decision read operations, respectively.

Referring to FIG. 6A, during the hard decision decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ and $V_{SD2}$, which have different voltages from the hard decision read voltage $V_{HD}$, are applied to the memory cell.

Referring to FIG. 6A, during the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the ECC unit 130 may generate a soft decision read data 2-4 or the LLR through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses (the logic values of '1' and '0') of the hard decision read data 2-1. On the other hand, the value '0' of the soft decision read data 2-4 may show a "weak" probability of the first and second statuses of the hard decision read data 2-1.

Referring to FIG. 6B, during the hard decision decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the soft decision decoding operation of step S530, the LLR may be generated through the soft decision read operation where the soft decision read voltages $V_{SD1}$ to $V_{SD6}$, which have different voltages from the hard decision read voltage $V_{HD}$, are applied to the memory cell.

Referring to FIG. 6B, during the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 6A. The ECC unit 130 may generate a first soft decision read data 3-2 '1001' or the LLR through the XNOR operation to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which have different voltages from the first and second soft decision read voltages $V_{SD1}$ and $V_{SD2}$ are applied to the memory cell, which is similar to the 2-bit soft decision read operation described with reference to FIG. 6A. The ECC unit 130 may generate a second soft decision read data 3-3 ('10101') or the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status (the logic value of '1') of the first soft decision read data 3-2. On the other hand, the value '0' of the second soft decision read data 3-3 may show a "strong" probability of the first status of the first soft decision read data 3-2.

In a similar way, the value '1' of the second soft decision read data 3-3 may show a "very weak" probability of the second status (the logic value of '0') of the first soft decision read data 3-2. On the other hand, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 6A.

Figure 7A:
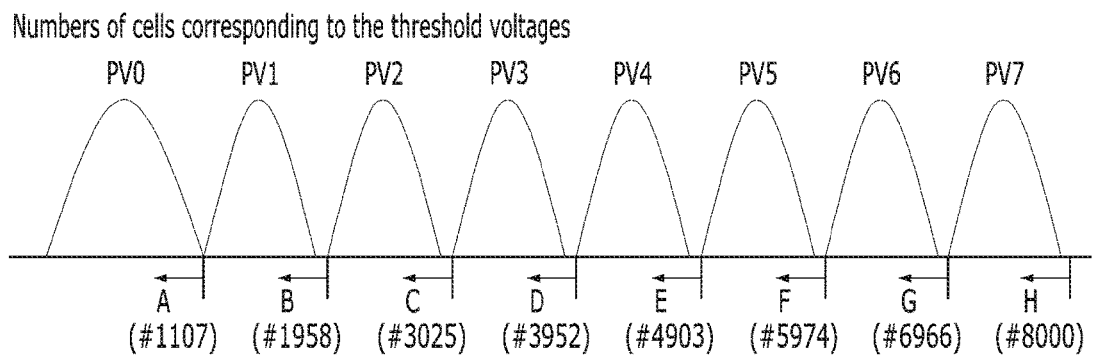
FIG. 7A is a schematic diagram illustrating number of cells corresponding to the threshold voltages.

FIG. 7A is a diagram illustrating accumulated number of cells corresponding to threshold voltages applied to word lines.

FIG. 7A shows distribution of threshold voltages representing available eight (8) states PV0 to PV7 of 3-bit triple level cell (TLC). The voltage supply circuit 230 may provide respective word lines with the threshold voltages corresponding to the available eight (8) states PV0 to PV7. The threshold voltages corresponding to the available eight (8) states PV0 to PV7 may be different from one another. For example, the threshold voltage corresponding to the zeroth state PV0 may be lower than the threshold voltage corresponding to the seventh state PV7.

Number of cells corresponding to the threshold voltages may be accumulated as the threshold voltages increase. As exemplified in FIG. 7A, a number of cells of accumulation index "A" corresponding to the threshold voltage representing the zeroth state PV0 may be 1,107, a number of cells of accumulation index "B" corresponding to the threshold voltage representing the first state PV1 may be 1,958, and a number of cells of accumulation index "H" corresponding to the threshold voltage representing the seventh state PV7 may be 8,000.

A total number of cells coupled to a word line may be predetermined. As exemplified in FIG. 7A, a total number of cells coupled to a word line may be the number of cells of accumulation index "H" corresponding to the threshold voltage representing the seventh state PV7, that is, 8,000.

In accordance with an embodiment of the present invention, respectively accumulated number of cells corresponding to the threshold voltages may be predetermined. For example, when a total number of cells coupled to a word line is 8,000, a number of cells of accumulation index "A" corresponding to the threshold voltage representing the zeroth state PV0 may be 1,000, a number of cells of accumulation index "B" corresponding to the threshold voltage representing the first state PV1 may be 2,000, and a number of cells of accumulation index "D" corresponding to the threshold voltage representing the third state PV3 may be 4,000.

In accordance with an embodiment of the present invention, as described with reference to FIGS. 8A and 8B, information of respective number of cells corresponding to the threshold voltages may be stored during a write operation. After that, when a read fail occurs during a read operation, an optimal read voltage may be determined on the basis of the stored information of respective number of cells corresponding to the threshold voltages. However, the information of respective number of cells corresponding to the threshold voltages may require a great amount of storage space. For example, when a total number of cells coupled to a word line is 8,000, at least 13 bits ($2^{13}$=8192) of storage space may be required to store the information of respective number of cells corresponding to the threshold voltages. In accordance with an embodiment of the present invention, it is possible to reduce the storage space for storing the information of respective number of cells corresponding to the threshold voltages by allocating the information of number of cells corresponding to the threshold voltages respectively to predetermined bits representing a plurality of ranges of accumulated cell numbers.

Figure 7B:
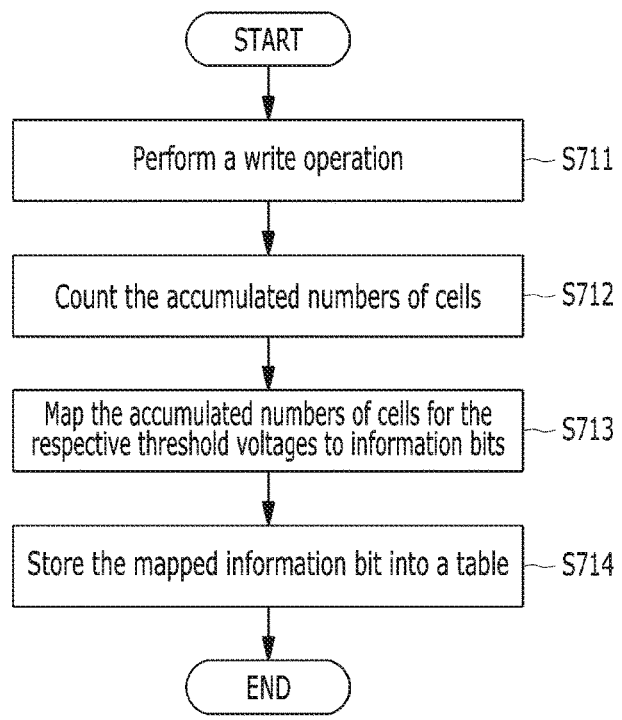
FIG. 7B is a flowchart illustrating an operation of the counting unit and the mapping unit.

FIG. 7B is a flowchart illustrating an operation of the counting unit 131 and the mapping unit 132.

When the semiconductor memory device 200 performs a write operation at step S711, the counting unit 131 may count accumulated number of cells coupled to a target word line for the respective threshold voltages at step S712.

At step S713, the mapping unit 132 may map the accumulated number of cells for the respective threshold voltages to information bits.

Figure 7C:
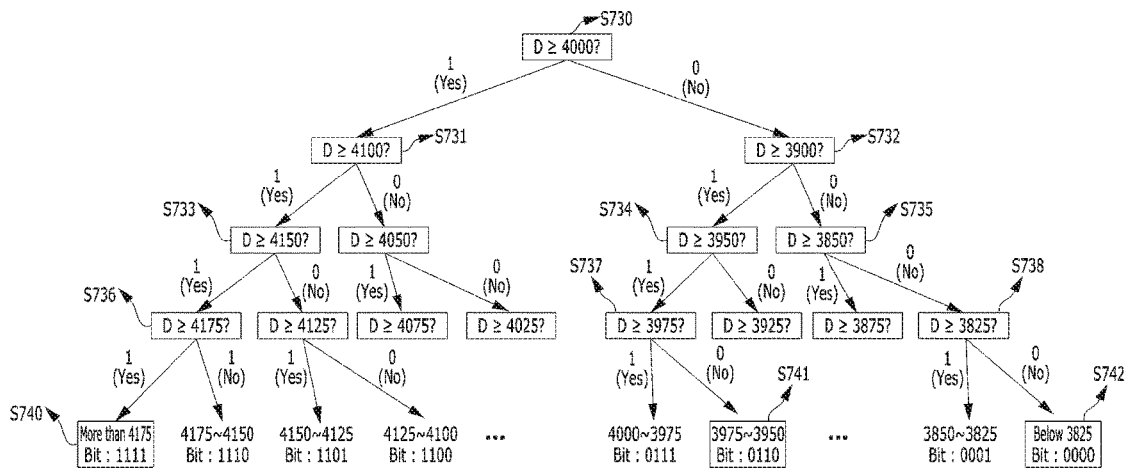
FIG. 7C and FIG. 7D are block diagrams schematically illustrating a process of exemplifying the accumulated number of cells for the respective threshold voltages mapped to 4-bit information bits.
Figure 7D:
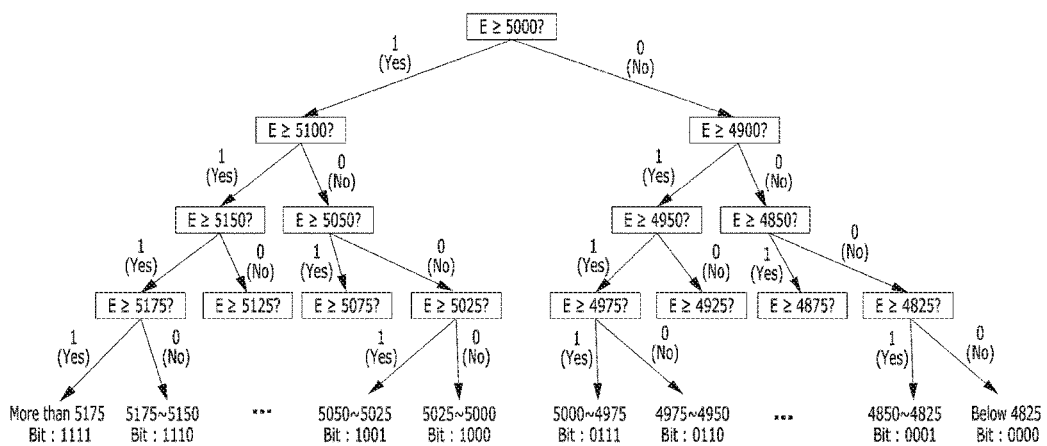

FIGS. 7C and 7D show the mapping operation of mapping the accumulated number of cells for the respective threshold voltages to information bits. FIGS. 7C and 7D exemplify the accumulated number of cells for the respective threshold voltages mapped to 4-bit information bits.

Referring to FIG. 7C, the 4-bit information bits may have 16 binary values from "0000" to "1111", which may respectively represent 16 ranges of the accumulated cell numbers. The mapping unit 132 may map the accumulated number of cells for the threshold voltages to a corresponding binary value of the 4-bit information bits, which represents a corresponding one among the 16 ranges of the accumulated number of cells. For example, when the accumulated number of cells counted by the counting unit 131 is 3,952, the mapping unit 132 may map the 3,952 accumulated number of cells to a binary value "0110" of the 4-bit information bits, which represents a range from 3,950 to 3,975 of the accumulated number of cells.

The range of the accumulated number of cells may be determined by adding and subtracting a predetermined amount to and from a predicted number of cells of accumulation index corresponding to the threshold voltage. Referring to above-described example, a predicted number of cells of accumulation index "D" corresponding to the third threshold voltage representing the third state PV3 is 4,000 and thus the range of the accumulated number of cells may be determined on the basis of the predicted number of cells of accumulation index "D" corresponding to the third threshold voltage representing the third state PV3 (i.e., 4,000) when allocating respective accumulated number of cells corresponding to the threshold voltages to the 4-bit information bits (i.e., the range of the accumulated number of cells) through the accumulation indexes, as illustrated by bottom nodes in FIG. 7C.

The predetermined amount for determining the range of the accumulated number of cells may be arbitrary, and FIG. 7C exemplifies the predetermined amount having a value of 25. As exemplified by the bottom nodes in FIG. 7C, the 4-bit information bits having a binary value "0000" may represent a range under a number of 3,825 and the 4-bit information bits having a binary value "1111" may represent a range over a number of 4,175. The 4-bit information bits may represent the range of the accumulated number of cells having a value of 25. As exemplified in FIG. 7C, the 4-bit information bits having a binary value "0110" may represent a range of the accumulated number of cells between values of 3,950 and 3,975.

The mapping unit 132 may map the accumulated number of cells for the respective threshold voltages to the 4-bit information bits according to the binary search scheme. According to the binary search scheme, an arbitrary mid-ranged value may be selected and then it is determined whether or not the selected value is greater or smaller than a target value. Hence, through the binary search scheme, probability and speed to find the target value may be improved.

The mapping unit 132 may compare the respective accumulated number of cells for the respective threshold voltages with a reference number of cells. When a respective accumulated number of cells for a threshold voltage is greater than the reference number of cells, the mapping unit 132 may allocate a binary value 1 to the 4-bit information bits. When a respective accumulated number of cells for a threshold voltage is smaller than the reference number of cells, the mapping unit 132 may allocate a binary value 0 to the 4-bit information bits. The binary values 1 and 0 may be allocated in descending order from a most significant bit to a lease significant bit. For example, the binary values 1 and 0 may be allocated to the fourth bit ($2^3$), the third bit ($2^2$), the second bit ($2^1$) and the first bit ($2^0$) of the 4-bit information bits in order.

The reference number of cells may depend on steps S730 to S742, which will be described later. Steps S730 to S742 illustrated in FIG. 7C represents only a part of the course of determining the 4-bit information bits, which is performed by the mapping unit 132. In the remaining part of the course of determining the 4-bit information bits, description of which will be omitted, the mapping unit 132 may determine the 4-bit information bit follows.

At step S730, the mapping unit 132 may determine whether or not a number of cells of accumulation index "D" is greater than the reference number of cells (e.g., 4,000). When the number of cells of accumulation index "D" is greater than the reference number of cells (4,000), the mapping unit 132 may allocate a binary value 1 to the fourth bit ($2^3$) of the 4-bit information bits. Then, at step S731, the mapping unit 132 may determine whether or not the number of cells of accumulation index "D" is greater than the reference number of cells (e.g., 4,100).

When the number of cells of accumulation index "D" is smaller than the reference number of cells (4,000), the mapping unit 132 may allocate a binary value 0 to the fourth bit ($2^3$) of the 4-bit information bits. Then, at step S732, the mapping unit 132 may determine whether or not the number of cells of accumulation index "D" is greater than the reference number of cells (e.g., 3,900).

When the number of cells of accumulation index "D" is greater than the reference number of cells (4,100) at step S731, the mapping unit 132 may allocate a binary value 1 to the third bit ($2^2$) of the 4-bit information bits. Then, at step S733, the mapping unit 132 may determine whether or not the number of cells of accumulation index "D" is greater than the reference number of cells (e.g., 4,150).

When the number of cells of accumulation index "D" is greater than the reference number of cells (3,900) at step S732, the mapping unit 132 may allocate a binary value 1 to the third bit ($2^2$) of the 4-bit information bits. Then, at step S734, the mapping unit 132 may determine whether or not the number of cells of accumulation index "D" is greater than the reference number of cells (e.g., 3,950).

When the number of cells of accumulation index "D" is smaller than the reference number of cells (3,900) at step S732, the mapping unit 132 may allocate a binary value 0 to the third bit ($2^2$) of the 4-bit information bits. Then, at step S735, the mapping unit 132 may determine whether or not the number of cells of accumulation index "D" is greater than the reference number of cells (e.g., 3,850).

When the number of cells of accumulation index "D" is greater than the reference number of cells (4,150) at step S733, the mapping unit 132 may allocate a binary value 1 to the second bit ($2^1$) of the 4-bit information bits. Then, at step S736, the mapping unit 132 may determine whether or not the number of cells of accumulation index "D" is greater than the reference number of cells (e.g., 4,175).

When the number of cells of accumulation index "D" is greater than the reference number of cells (3,950) at step S734, the mapping unit 132 may allocate a binary value 1 to the second bit ($2^1$) of the 4-bit information bits. Then, at step S737, the mapping unit 132 may determine whether or not the number of cells of accumulation index "D" is greater than the reference number of cells (e.g., 3,975).

When the number of cells of accumulation index "D" is smaller than the reference number of cells (3,850) at step S735, the mapping unit 132 may allocate a binary value 0 to the second bit ($2^1$) of the 4-bit information bits. Then, at step S738, the mapping unit 132 may determine whether or not the number of cells of accumulation index "D" is greater than the reference number of cells (e.g., 3,825).

When the number of cells of accumulation index "D" is greater than the reference number of cells (4,175) at step S736, the mapping unit 132 may allocate a binary value 1 to the first bit ($2^0$) of the 4-bit information bits.

When the number of cells of accumulation index "D" is smaller than the reference number of cells (3,975) at step S737, the mapping unit 132 may allocate a binary value 0 to the first bit ($2^0$) of the 4-bit information bits.

When the number of cells of accumulation index "D" is smaller than the reference number of cells (3,825) at step S738, the mapping unit 132 may allocate a binary value 0 to the first bit ($2^0$) of the 4-bit information bits.

At step S740, the mapping unit 132 may allocate a binary value "1111" to the 4-bit information bits according to steps S730, S731, S733 and S736. The 4-bit information bits having a binary value "1111" may represent the number of cells of accumulation index "D" over a number of 4,175.

At step S741, the mapping unit 132 may allocate a binary value "0110" to the 4-bit information bits according to steps S730, S732, S734 and S737. The 4-bit information bits having a binary value "0110" may represent the number of cells of accumulation index "D" ranging from 3,950 to 3,975.

At step S742, the mapping unit 132 may allocate a binary value "0000" to the 4-bit information bits according to steps S730, S732, S735 and S738. The 4-bit information bits having a binary value "0000" may represent the number of cells of accumulation index "D" under a number of 3,825.

FIG. 7D exemplifies an operation of determining binary values of 4-bit information bits for the accumulation index "E". Referring to FIG. 7D, the range of the accumulated number of cells may be determined by adding and subtracting a predetermined amount to and from a number of 5,000. The predetermined amount may be arbitrary, and FIG. 7D exemplifies the predetermined amount having a value of 25.

As illustrated in FIG. 7D, the 4-bit information bits having a binary value "0000" may represent a range under a number of 4,825 and the 4-bit information bits having a binary value "1111" may represent a range over a number of 5,175. The 4-bit information bits may represent the range of the accumulated number of cells having a value of 25. As exemplified in FIG. 7D, the 4-bit information bits having a binary value "0001" may represent a range of the accumulated number of cells between values of 4,825 and 4,850. The operation of mapping the accumulated number of cells for the respective threshold voltages to the 4-bit information bits illustrated in FIG. 7D may have substantially the same principle as described with reference to FIG. 7C.

Figure 7E:
FIG. 7E and FIG. 7F are diagrams schematically illustrating a process of exemplifying an operation of determining binary values of 4-bit information bits for the respective accumulation indices corresponding to the respective threshold voltages.

FIG. 7E exemplifies an operation of determining binary values of 4-bit information bits for the respective accumulation indices corresponding to the respective threshold voltages. As described above with reference to FIGS. 7C and 7D, the mapping unit 132 may map the accumulated number of cells, which is counted by the mapping unit 132, to the 4-bit information bits for the respective accumulation indices corresponding to the respective threshold voltages.

A binary value of the 4-bit information bits may have different meaning for the respective accumulation indices. For example, a binary value "0110" of the 4-bit information bits may represent the number of cells of accumulation index "D" ranging from 3,950 to 3,975 for a case of the accumulation index "D" corresponding to the threshold voltage representing the third state PV3. For example, a binary value "0110" of the 4-bit information bits may represent the number of cells of accumulation index "D" ranging from 5,950 to 5,975 for a case of the accumulation index "F" corresponding to the threshold voltage representing the fifth state (PV5).

As described above with reference to FIG. 7B, the mapping unit 132 may store the mapped 4-bit information bits into a table thereof. The table for storing the mapped 4-bit information bits may be implemented by another block (of SLC, MLC, TLC, QLC and so forth), another page of the same block, another volatile memory (e.g., SRAM, DRAM and so forth), or a nonvolatile memory (e.g., NOR flash, MRAM, PCRAM and so forth).

Figure 7F:

FIG. 7F illustrates an operation of determining binary values of an information bit for the respective accumulation indices corresponding to the respective threshold voltages in accordance with another embodiment of the present invention.

As exemplified in FIG. 7F, the mapping unit 132 may indicate ranges of the accumulated cell numbers for the respective accumulation indices by using a 1-bit information bit. For example, a predicted number of cells of accumulation index "A" corresponding to the first threshold voltage representing the zeroth state PV0 is 1,000. When a counted number of cells of accumulation index "A" corresponding to the first threshold voltage representing the zeroth state PV0 is greater than 1,000, the mapping unit 132 may allocate a binary value 1 to the 1-bit information bit. When a counted number of cells of accumulation index "A" corresponding to the first threshold voltage representing the zeroth state PV0 is smaller than 1,000, the mapping unit 132 may allocate a binary value 0 to the 1-bit information bit.

As described above with reference to FIG. 7B, the mapping unit 132 may store the mapped 1-bit information bit into a table thereof. The table for storing the mapped 1-bit information bit may be implemented by another block (of SLC, MLC, TLC, QLC and so forth), another page of the same block, another volatile memory (e.g., SRAM, DRAM and so forth), or a nonvolatile memory (e.g., NOR flash, MRAM, PCRAM and so forth).

Referring back to FIG. 7B, at step S714, mapping unit 132 may store the mapped information bit into a table thereof. The table for storing the mapped information bit may be implemented by another block (of SLC, MLC, TLC, QLC and so forth), another page of the same block, another volatile memory (e.g., SRAM, DRAM and so forth), or a nonvolatile memory (e.g., NOR flash, MRAM, PCRAM and so forth).

Steps S711 to S714 may be repeatedly performed when the accumulated number of cells changes due to deterioration characteristics of a memory cell.

Figure 8A:
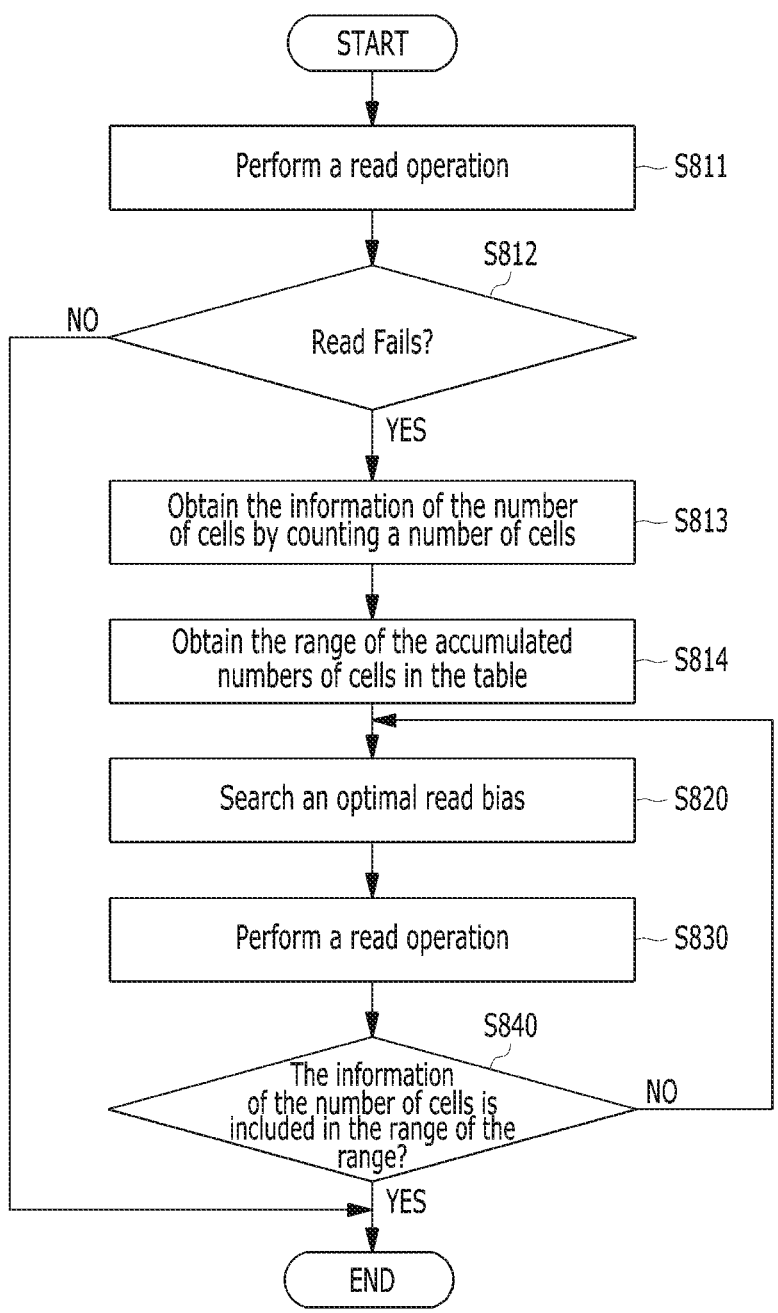
FIG. 8A is a flowchart illustrating an operation of a read bias determination unit of searching an optimal read bias using the mapped information bits during a write operation.

FIG. 8A illustrates an operation of a read bias determination unit 133 of searching an optimal read bias during a current read operation using the information bits, which are mapped during a previously performed write operation.

At steps S811 and S812, the current read operation may be performed and it is determined whether or not the read operation fails. During the read operation of step S811, a default read bias or a predetermined read bias may be used.

When it is determined that the read operation fails at step S812, information of a number of cells read according to the read voltage of the failed read operation of step S812 may be obtained at step S813. The controller 100 may obtain the information of the number of cells by counting a number of cells, which are coupled to a target word line of the failed read operation and turned on by the read voltage of the failed read operation.

Referring to FIGS. 7A and 7E, in an exemplary case where the read voltage is the first threshold voltage RV1 representing the first state PV1, there may be obtained an accumulated number (e.g., 1,958) of cells for the accumulated index "B" corresponding to the first threshold voltage RV1 representing the first state PV1. When the read voltage is the third threshold voltage RV3 representing the third state PV3, there may be obtained an accumulated number (e.g., 3,952) of cells for the accumulated index "D" corresponding to the third threshold voltage RV3 representing the third state PV3.

At step S814, there may be obtained the range of the accumulated number of cells through the information bits stored in the table of the mapping unit 132. The read bias determination unit 133 may store the information bits therein. The information bits may represent the read voltage of the failed read operation. Referring to FIGS. 7A and 7E, when the read voltage is the first threshold voltage RV1 representing the first state PV1, there may be obtained information bits (e.g., the information bits having binary value "0110") for the accumulated index "B" corresponding to the first threshold voltage representing the first state PV1. When the read voltage is the third threshold voltage RV3 representing the third state PV3, there may be obtained information bits (e.g., the information bits having binary value "0110") for the accumulated index "D" corresponding to the third threshold voltage representing the third state PV3. Through the obtained information bits, a range of the accumulated number of cells may be obtained. For example, through the obtained information bits "0110" for the accumulated index "B", a range of the accumulated number of cells ranging from 1,950 to 1,975 may be obtained. For example, through the obtained information bits "0110" for the accumulated index "D", a range of the accumulated number of cells ranging from 3,950 to 3,975 may be obtained.

At step S820, the read bias determination unit 133 may search for an optimal read bias. The read bias determination unit 133 may search for an optimal read bias by comparing the range of the accumulated number of cells, which is obtained through the obtained information bits at step S814, with the information of the number of cells read according to the read voltage of the failed read operation.

For example, when the number of cells read according to the read voltage of the failed read operation is greater than a maximum value of the range of the accumulated number of cells, which is obtained through the obtained information bits at step S814, the read bias determination unit 133 may decrease the read bias for a next read operation. For example, when the number of cells read according to the read voltage of the failed read operation is smaller than a minimum value of the range of the accumulated number of cells, which is obtained through the obtained information bits at step S814, the read bias determination unit 133 may increase the read bias for a next read operation.

At step S830, a read operation may be performed according to the increased/decreased read bias.

At step S840, it may be determined whether or not the number of cells read according to the changed read bias falls in the range of the accumulated number of cells. When it is determined that the number of cells read according to the changed read bias does not fall in the range of the accumulated number of cells, the process may go back to step S820 and the read bias determination unit 133 may search for another optimal read bias. Steps S820 to S840 may be repeated until the number of cells read according to the changed read bias falls in the range of the accumulated number of cells.

Figure 8B:
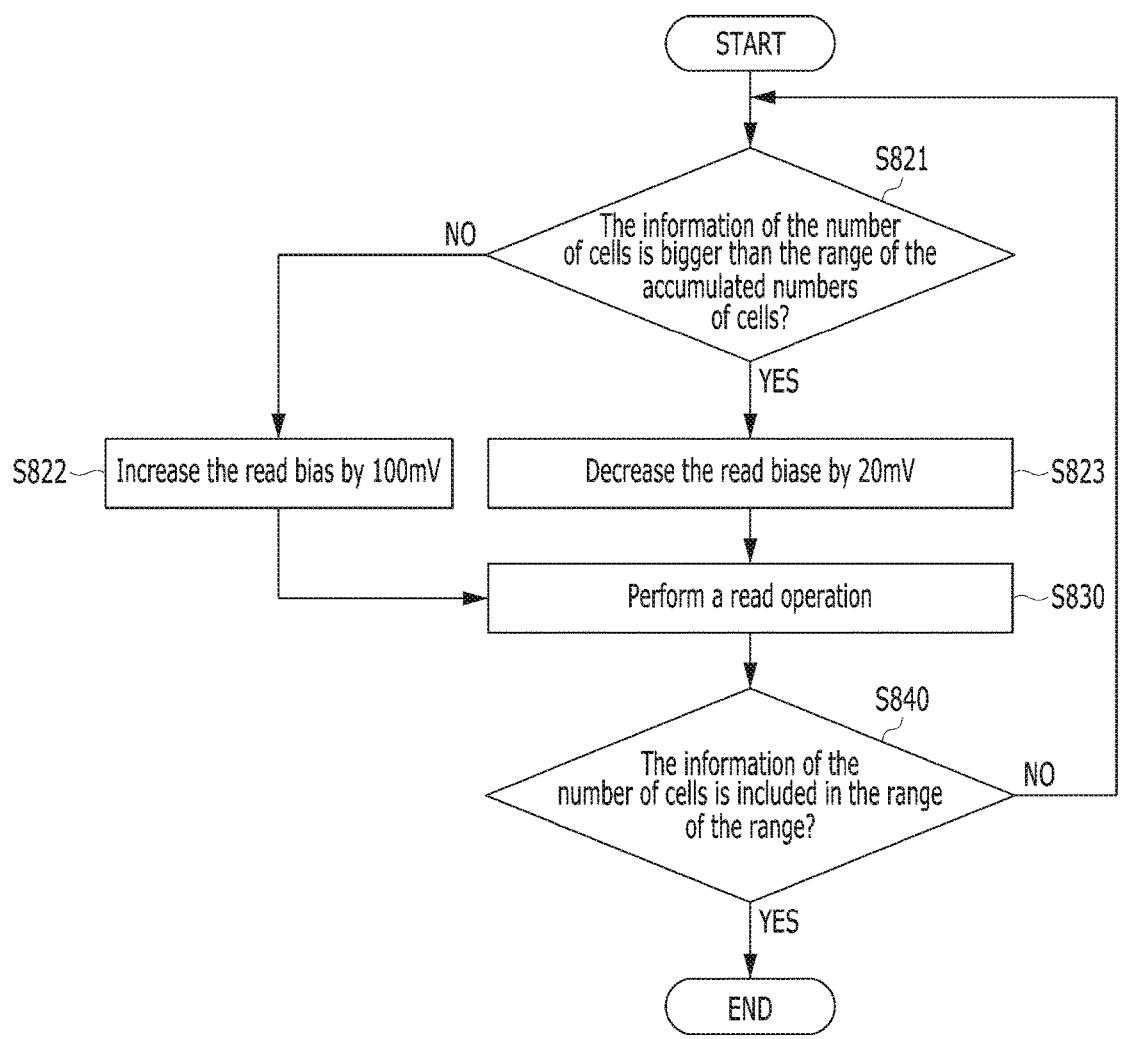
FIG. 8B is a flowchart illustrating an example of a detailed operation of the read bias determination unit shown in FIG. 8A.

FIG. 8B illustrates an example of steps S820 to S840 of FIG. 8A in detail.

At step S821, the read bias determination unit 133 may search for an optimal read bias by comparing the range of the accumulated number of cells, which is obtained through the obtained information bits at step S814, with the information of the number of cells read according to the read voltage of the failed read operation. When the number of cells read according to the read voltage of the failed read operation is smaller than a minimum value of the range of the accumulated number of cells, which is obtained through the obtained information bits at step S814, the read bias determination unit 133 may increase the read bias by an amount of 100 mV for a next read operation at step S822. When the number of cells read according to the read voltage of the failed read operation is greater than a maximum value of the range of the accumulated number of cells, which is obtained through the obtained information bits at step S814, the read bias determination unit 133 may decrease the read bias by an amount of 20 mV for a next read operation at step S823.

At step S830, a read operation may be performed according to the increased/decreased read bias.

At step S840, it may be determined whether or not the number of cells read according to the changed read bias falls in the range of the accumulated number of cells. When it is determined that the number of cells read according to the changed read bias does not fall in the range of the accumulated number of cells, the process may go back to step S821 and the read bias determination unit 133 may search another optimal read bias.

Figure 9:
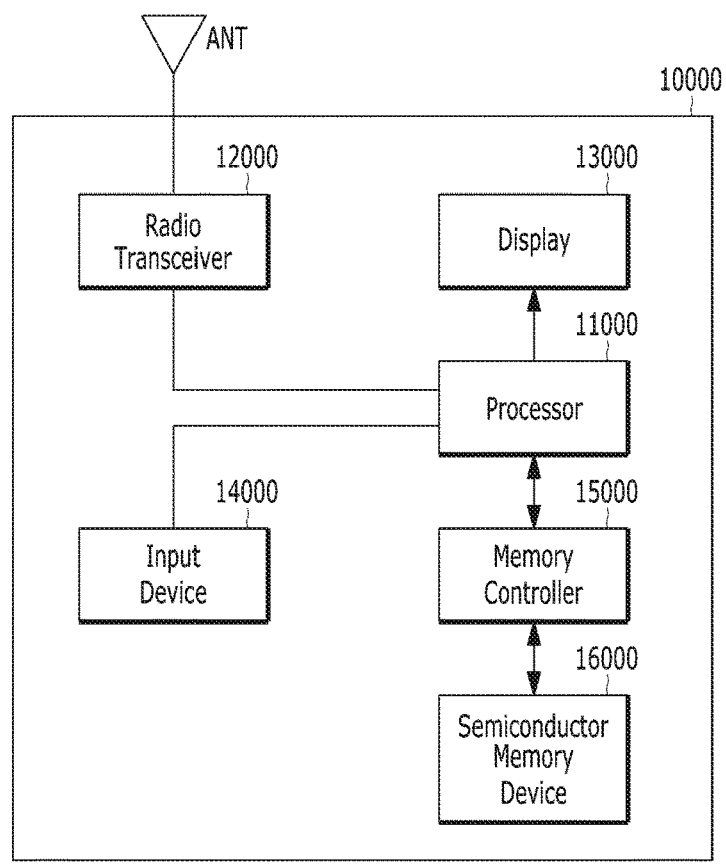
FIG. 9 is a block diagram schematically illustrating an electronic device including a semiconductor memory system in accordance with an embodiment of the present invention.

FIG. 9 is a block diagram schematically illustrating an electronic device 10000 including a memory controller 15000 and a semiconductor memory device 16000 in accordance with an embodiment of the present invention.

Referring to FIG. 9, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 8E. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 10:
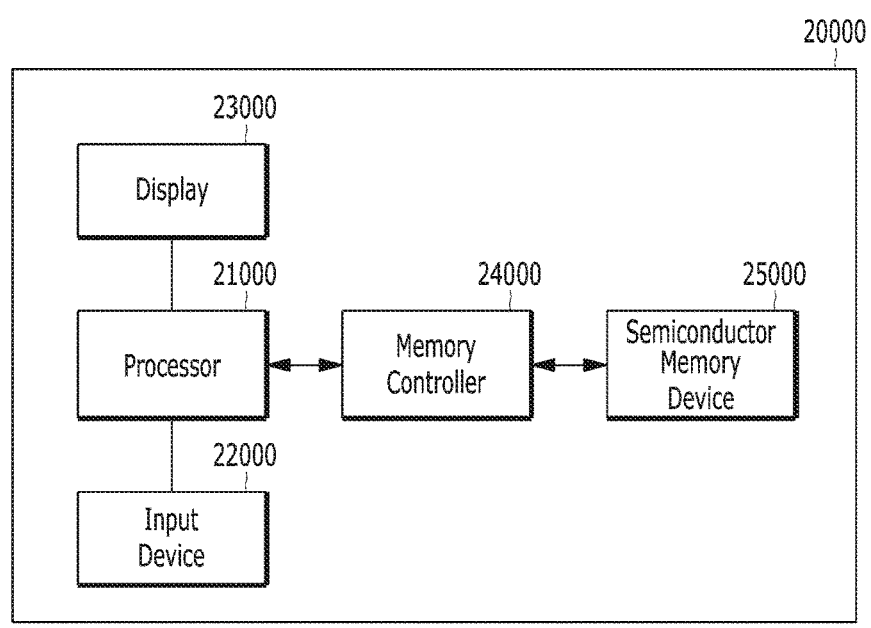
FIG. 10 is a block diagram schematically illustrating an electronic device including a semiconductor memory system in accordance with an embodiment of the present invention.

FIG. 10 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., the flash memory device, and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 11:
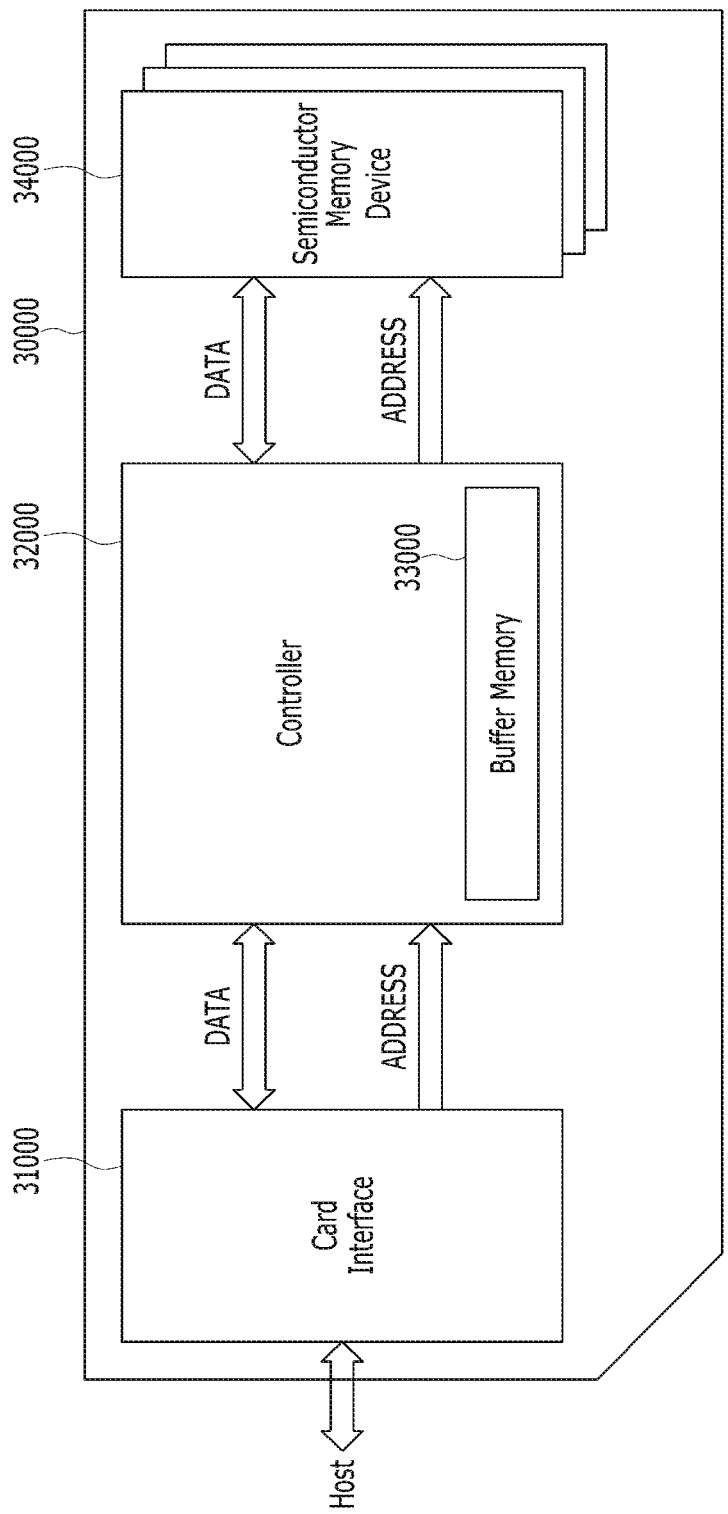
FIG. 11 is a block diagram schematically illustrating an electronic device including a semiconductor memory system in accordance with an embodiment of the present invention.

FIG. 11 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 12:
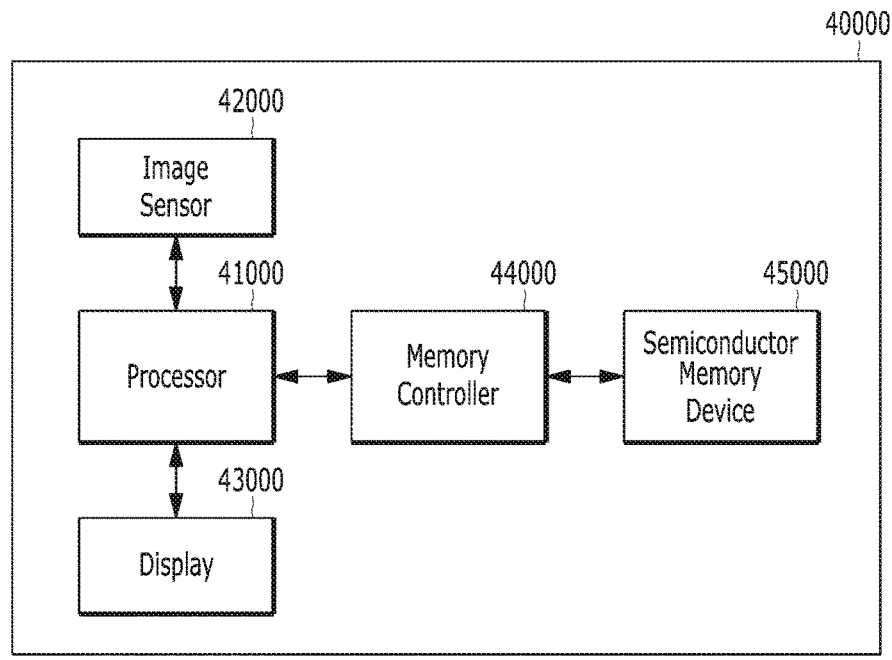
FIG. 12 is a block diagram schematically illustrating an electronic device including a semiconductor memory system in accordance with an embodiment of the present invention.

FIG. 12 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 8E, respectively.

Referring to FIG. 12, the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 13:
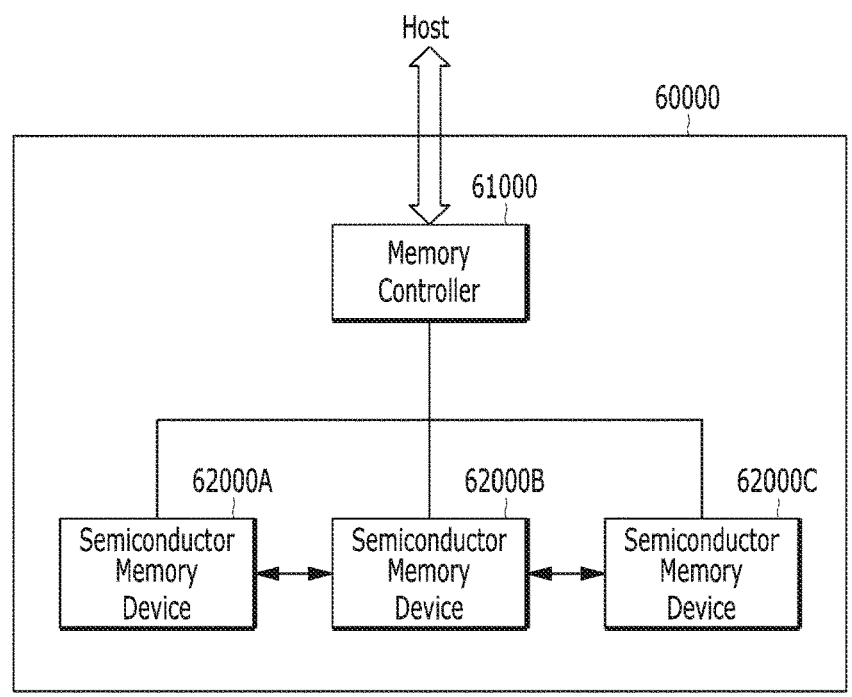
FIG. 13 is a block diagram schematically illustrating an electronic device including a semiconductor memory system in accordance with another embodiment of the present invention.

FIG. 13 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 8E, respectively.

Referring to FIG. 13, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 14:
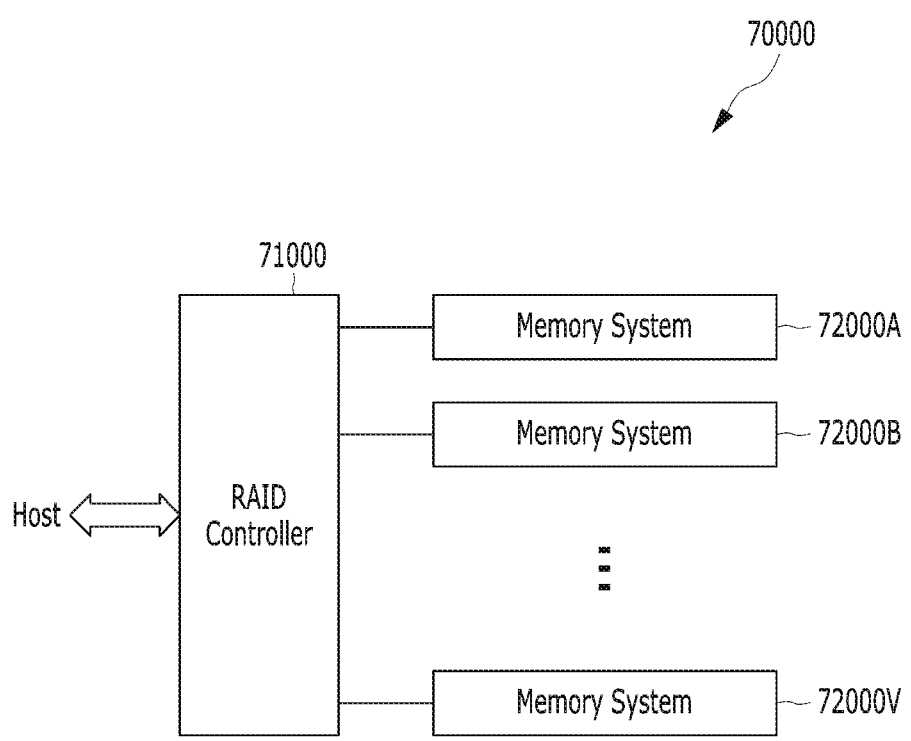
FIG. 14 is a block diagram of a data processing system including the electronic device shown in FIG. 13.

FIG. 14 is a block diagram of a data processing system including the electronic device 6000 described with reference to FIG. 13.

Referring to FIGS. 13 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 13. The memory systems 72000A to 72000N may form a RAID array. The data storage device 70000 may be implemented by an SSD.

During a program operation, the RAID controller 71000 may output program data, which is output from a host, to one of the memory systems 72000A to 72000N according to one selected from a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as defined in the following claims.

What is claimed is:

1. A semiconductor apparatus comprising:
   a memory device including at least a word line; and
   a controller suitable for controlling the memory device to perform a write operation and a read operation,
   wherein the controller includes a counting unit suitable for counting a number of memory cells coupled to the word line for respective threshold voltages,
   wherein the controller controls the memory device to perform a read operation based on the counted number of memory cells for the respective threshold voltages, and
   wherein the controller further includes a mapping unit suitable for converting the counted number of memory cells for the respective threshold voltages into range values of accumulated number of cells and mapping the range value of accumulated number of cells to information bits.

2. The semiconductor apparatus of claim 1, wherein the information bits have a value representing one among the range values of accumulated number of cells.

3. The semiconductor apparatus of claim 1, wherein the mapping unit maps the counted number of memory cells for the respective threshold voltages to the information bits in a table having a plurality of range values of accumulated number of cells and the information bits.

4. The semiconductor apparatus of claim 3, wherein the mapping unit generates the table by mapping the counted number of memory cells for the respective threshold voltages to the information bits through a binary search scheme.

5. The semiconductor apparatus of claim 3,
   wherein the controller counts as a first value a number of memory cells coupled to the word line and turned on according to a first read voltage, and
   wherein the controller further includes a read bias determination unit suitable for determining, when the read operation with the first read voltage fails, a second read voltage based on the first value and a range value of accumulated number of cells, which corresponds to the first read voltage among the plurality of range values of accumulated number of cells included in the table.

6. The semiconductor apparatus of claim 5, wherein the read bias determination unit determines the second read voltage such that difference between the first value and a maximum value of the range value of accumulated number of cells, which corresponds to the first read voltage, or difference between the first value and a minimum value of the range of accumulated number of cells, which corresponds to the first read voltage, is under a predetermined threshold value.

7. The semiconductor apparatus of claim 5,
   wherein the read bias determination unit decreases the second read voltage when the first value is greater than a maximum value of the range value of accumulated number of cells, which corresponds to the first read voltage, and
   wherein the read bias determination unit increases the second read voltage when the first value is smaller than a minimum value of the range value of accumulated number of cells, which corresponds to the first read voltage.

8. The semiconductor apparatus of claim 5, wherein the first read voltage is a default read voltage or a predetermined read voltage.

9. An operating method of a controller, the method comprising:
   counting a number of memory cells coupled to a word line for respective threshold voltages; and
   performing a read operation based on the counted number of memory cells for the respective threshold voltages, and
   converting the counted number of memory cells for the respective threshold voltages into range values of accumulated number of cells and mapping the range value of accumulated number of cells to information bits.

10. The method of claim 9, wherein the information bits have a value representing one among the range values of accumulated number of cells.

11. The method of claim 9, wherein the converting of the counted number of memory cells includes mapping the counted number of memory cells for the respective threshold voltages to the information bits in a table having a plurality of range values of accumulated number of cells and the information bits.

12. The method of claim 11, wherein the converting of the counted number of memory cells further includes generating the table by mapping the counted number of memory cells for the respective threshold voltages to the information bits through a binary search scheme.

13. The method of claim 11,
wherein the counting is performed by counting as a first value a number of memory cells coupled to the word line and turned on according to a first read voltage, and
further comprising determining, when the read operation with the first read voltage fails, a second read voltage based on the first value and a range value of accumulated number of cells, which corresponds to the first read voltage among the plurality of range values of accumulated number of cells included in the table.

14. The method of claim 13, wherein the second read voltage is determined such that difference between the first value and a maximum value of the range value of accumulated number of cells, which corresponds to the first read voltage, or difference between the first value and a minimum value of the range of accumulated number of cells, which corresponds to the first read voltage, is under a predetermined threshold value.

15. The method of claim 13, wherein the determining of the second read voltage includes:
decreasing the second read voltage when the first value is greater than a maximum value of the range value of accumulated number of cells, which corresponds to the first read voltage; and
increasing the second read voltage when the first value is smaller than a minimum value of the range value of accumulated number of cells, which corresponds to the first read voltage.

16. The method of claim 13, wherein the first read voltage is a default read voltage or a predetermined read voltage.

17. An operating method of a controller the method comprising:
allocating range values to accumulated number of memory cells coupled to a word line for threshold voltages, respectively;
counting as a cell count an accumulated number of memory cells coupled to the word line and turned on according to a threshold voltage during a read operation;
adjusting, when the read operation fails, the threshold voltage of the read operation based on the cell count and one corresponding to the read-failed threshold voltage among the range values; and
repeating the counting and the adjusting until the cell count falls in the range value corresponding to the adjusted threshold voltage of the read operation.

* * * * *